US007493180B2

(12) United States Patent
Sokolov

(10) Patent No.: US 7,493,180 B2
(45) Date of Patent: Feb. 17, 2009

(54) METHOD FOR RIAA CORRECTION OF AUDIO SIGNAL WITH USE OF TRANSFORMER AND CAPACITOR

(75) Inventor: Alexander Y. Sokolov, Moscow (RU)

(73) Assignee: Outsource Technologies, Inc., San Rafael, CA (US)

( * ) Notice: Subject to any disclaimer, the term of this patent is extended or adjusted under 35 U.S.C. 154(b) by 887 days.

(21) Appl. No.: 10/898,020

(22) Filed: Jul. 22, 2004

(65) Prior Publication Data
US 2005/0226443 A1   Oct. 13, 2005

(30) Foreign Application Priority Data
Apr. 8, 2004  (RU) ................. 2004110400

(51) Int. Cl.
*H04B 17/00* (2006.01)
(52) U.S. Cl. .................................... 700/94
(58) Field of Classification Search ........... 700/94;
336/56, 83, 170, 178, 212, 233, 234; 381/94.1–94.9, 381/98
See application file for complete search history.

(56) References Cited

U.S. PATENT DOCUMENTS

| 1,601,400 | A | 9/1926 | Latour | 332/173 |
|---|---|---|---|---|
| 2,911,586 | A | 11/1959 | Zelena | 323/302 |
| 2,932,787 | A | 4/1960 | Krabbe et al. | 323/334 |
| 3,188,552 | A | 6/1965 | Owen | 323/334 |
| 3,631,534 | A | 12/1971 | Hirota et al. | 336/155 |
| 5,737,203 | A | 4/1998 | Barrett | 363/75 |
| 5,978,491 | A | 11/1999 | Papadopoulos | 381/113 |
| 6,211,749 | B1 | 4/2001 | Yuzurihara et al. | 333/17.3 |

OTHER PUBLICATIONS

Anatoly Likhnitsky, "RX-corrector (Preamplifier with RIAA phono correction on the X-transformer)" *AudioMagazine* No. 5 (40), May 2001, pp. 167-173 (in Russian).
Anatoly Likhnitsky, "RX-corrector (Preamplifier with RIAA phono correction on the X-transformer)" *AudioMagazine* No. 5 (40), May 2001, pp. 167-173 (English translation by the author).

(Continued)

*Primary Examiner*—Suhan Ni
*Assistant Examiner*—Andrew C Flanders
(74) *Attorney, Agent, or Firm*—Joshua D. Isenberg; JDI Patent

(57) ABSTRACT

RIAA correction of audio frequency signals is disclosed. A RIAA-correcting pre-amplifier uses a transformer having a primary winding and two or more secondary windings, with two of the secondary windings playing an essential role in RIAA-correction. Frequency correction of a signal coming from one of the secondary windings is carried out on a resistance and capacitance circuit (RC-type of correction), while frequency correction of a signal coming from another of the secondary windings is carried out with the use of an inductance and resistance circuit (RL type of correction).

6 Claims, 2 Drawing Sheets

OTHER PUBLICATIONS

U.S. Appl. No. 10/898,013 to Alexander Sokolov, filed Jul. 22, 2004, entitled Method for RIAA Correction Without Capacitors in Correcting Circuits.

U.S. Appl. No. 10/897,574 to Alexander Sokolov, filed Jul. 22, 2004, entitled "Method for RIAA Correction of Audio Signal With the Use of Transformer".

Sendra/Smith, "Microelectronic Circuits", Fourth Edition, 1998, p. 183.

"PCT International Search Report" and "Written Opnion of the International Searching Authority" of the International Application No. PCT/US05/25377, Jun. 27, 2006.

International Search Report and Written Opinion of the International Searching Authority dated Sep. 26, 2008 - International Patent Application No. PCT/US05/25378, 11 pages.

A – windings I and II-2,  B – winding II-1

METHOD FOR RIAA CORRECTION OF AUDIO SIGNAL WITH USE OF TRANSFORMER AND CAPACITOR

CROSS REFERENCE TO RELATED APPLICATION

This application claims priority from Russian Patent Application 2004110400, to Alexander Sokolov, filed Apr. 8, 2004, the disclosures of which are incorporated herein by reference.

This application is related to commonly assigned co-pending U.S. patent application Ser. No. 10/898,013 to Alexander Sokolov entitled "METHOD FOR RIAA CORRECTION WITHOUT CAPACITORS IN CORRECTING CIRCUITS", which is filed concurrently herewith.

This application is also related to commonly assigned co-pending U.S. patent application Ser. No. 10/897,574 to Alexander Sokolov entitled "A METHOD FOR RIAA CORRECTION OF AUDIO SIGNAL WITH THE USE OF TRANSFORMER", which is filed concurrently herewith.

FIELD OF THE INVENTION

The invention relates to electronic equipment, hi-fi audio systems. It can be used in how-quality electronic pre-amplifiers for phono players (RIAA-correctors).

BACKGROUND

Audio signal recording on a phono disk is based on the well-known Recording Industry Association of America (RIAA) correction procedure. According to this procedure the amplitude of an electrical signal recorded on disk depends on the frequency. Such correction is carried out to improve the dynamic range of the signal. When the disk is played back, the electrical signal coming from the pickup cartridge to the output power amplifier and later to the speaker has to pass through a pre-amplifier with additional frequency correction, in which the reverse correction procedure is applied.

Mathematically expressed the frequency correction transmission function from the input to output of the pre-amplifier has the form:

$$U\text{out}/U\text{in}=\kappa 0*(1+i*w*b)/((1+i*w*b1)*(1+i*w*b2)),$$

where Uout and Uin are signal amplitudes at the output and input, respectively,

κο is frequency independent amplification factor, $$w=2*\pi*f,$$

f is the signal frequency, b=318, b1=75, b2=3180 are time constants, expressed in milliseconds, i is complex unity.

There are many different realizations of RIAA-correctors. Among them one can find transistor, solid state and vacuum tubes circuits.

Usually capacitors are implemented in such pre-amplifiers as the elements featuring frequency-dependent characteristics.

In spite of their simplicity of use, capacitors introduce the disturbances into the signal transmitted. This circumstance, however, degrades the audio characteristics of the pre-amplifier. The electrical parameters of capacitors depend essentially on the dielectrics used, the foil and the winding method. As a result capacitors possess such undesirable features as non-linearity, inductance, energetic losses during the electrical signal transmission, etc. Experts often notice the dependence of the sound on the capacitors types, the coarse sounding of cheap capacitors in the upper register of the sound signal, sticky and dim sound.

RIAA correction can be also done by means of a transformer with two secondary windings, as shown in FIG. 1. The transformer has a primary winding I and two secondary windings II-1 and II-2, which are loaded on two resistors. Electrical circuits of the type shown in FIG. 1 can provide the necessary form of amplitude vs. frequency curve of RIAA correction.

FIGS. 2a-2b show the physical construction of a transformer of the type shown in FIG. 1 in more detail. The transformer's core has a complicated form, which is expressed in different length of steel plates 1 and 3 in comparison with a central plate 2. In addition, after assembling the core, there exists additional air gap x between the central plate and a lower plate 4 (FIG. 2a).

The primary winding I is placed on the side plates 1 of the core, while the secondary winding II-2 is wound over the primary winding I, and the secondary winding II-1 is wound on a separate coil, placed on the plates 3 of the core. The position of the windings is illustrated in FIG. 2b.

The primary winding is connected to a vacuum tube base amplifying cascade, such that in the absence of a signal at the input a constant non-zero current is present in the primary winding.

The principle of RIAA correction of the circuit in FIG. 1 is based upon two leakage inductances of the secondary windings with respect to the primary winding. The first leakage inductance of the secondary winding II-2 has a small value and is due to parasitic leakage inductance of the winding. This leakage inductance is a feature of every transformer and is well described elsewhere. Parasitic leakage inductances are usually small and depend on the number of turns in the winding and the geometry of the winding, and also on the sectioning of the windings. By changing these parameters one can obtain the necessary value of leakage inductance.

The artificial leakage inductance of winding II-1 has a large value, which can be achieved only by splitting the original magnetic flux generated by the primary winding (which passes through plate 1 of the core) into two directions: one along plate 2 with air gap x, and another along plate 3 (see FIG. 2b).

As a result, some part of the magnetic flux of the primary winding I doesn't reach the winding II-1, and is closed on the plate 2 of the core.

Such construction provides high value of the leakage inductance of the core, which is difficult to achieve by other means.

Due to the leakage inductances the high frequency part of electrical signal, transmitted from the primary winding to each of the secondary windings and resistors, is reduced, therefore the transformation factor of the signal from the primary winding to each of the resistors depends on the frequency. The ratio of smaller leakage inductance of winding II-2 to the loading resistor is given and equal to a correction time constant b1 (75 microseconds), while the ratio of higher value of leakage inductance of winding II-1 to the loading resistor is equal to a correction time constant b2 (3180 microseconds). After the summation of the signals from the two resistors, taking into account the different transformation factors from the primary to each of the secondary windings, the signal amplitude at the output of the corrector has right frequency-corrected value.

The disadvantage of this method of signal RIAA correction is that an additional magnetic bridge (plate 2 in FIG. 2a) in the transformer core is necessary to provide the leakage inductance. The additional bridge increases the size and the cost of the core.

In addition, because the primary winding is placed on the side part of the core, the cross-section area of the core is two times lower than in the case of common placement of the winding at the central part. This circumstance reduces the inductance of the primary winding, which will affect the operation of the transformer at low frequencies.

Finally, such a method doesn't allow the use of high values of leakage inductances, which are restricted by the size of the transformer. One cannot wind as many turns as one wants to obtain any value of the inductance. Therefore, the leakage inductance cannot be made very high. Because the ratio of inductance to resistor is equal to the correction time, the resistor value is also limited. This in turn implies limitations on the first driver connected to the primary winding of the transformer, which has to have an output impedance that is much smaller than the driver's load.

DETAILED DESCRIPTION

Figure 1:
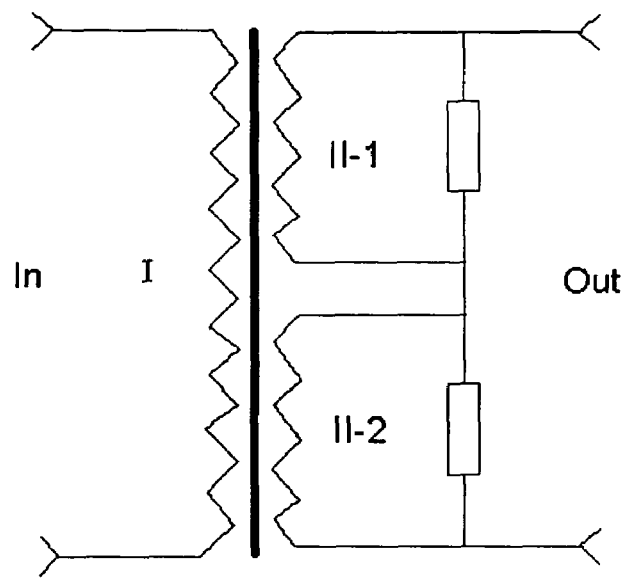
FIG. 1 shows the RIAA-correction circuit based on the transformer with two secondary windings.
Figure 2A:
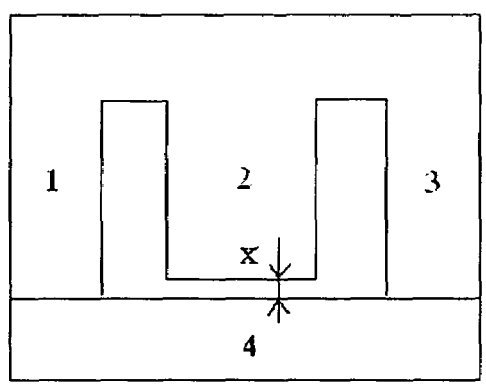
FIGS. 2*a*-2*b* show the construction of a transformer of the type shown in FIG. 1 in more detail.
Figure 2B:
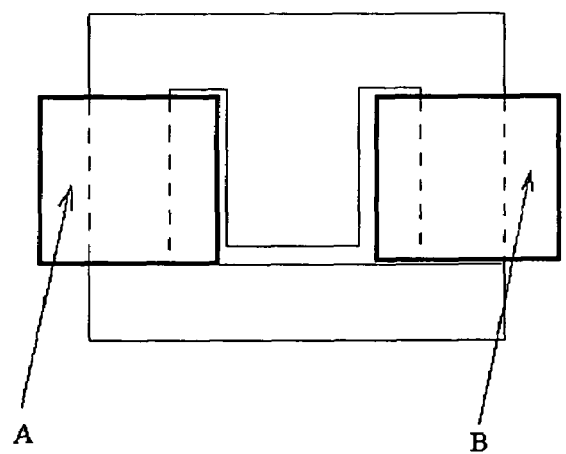

Consider the circuit in FIG. 1 in more detail. Let N1, N21, and N22 be the number of turns in the primary and first and second secondary windings, respectively. Let L1 and L2 respectively represent the inductances of the first and second secondary windings II-1 and II-2. Neglecting the active resistances of the windings and the losses in the core, the transmission factors S1 and S2 of the signal to each of the resistors from the primary winding will be equal to $$S1=(N21/N1)*R1/(R1+i*w*L1)=(N21/N1)/(1+i*w*t1)$$

for resistor R1, $$S2=(N22/N1)*R2/(R2+i*w*L2)=(N22/N1)/(1+i*w*t2)$$

for resistor R2. Here t1=L1/R1, t2=L2/R2.

The sum of S1 and S2 is equal to $$S1+S2=((N21+N22)/N1)*(1+i*w*t)/((1+i*w*t1)*(1+i*w*b2)),\quad(1)$$

where $$t=(N21*t2+N22*t1)/(N21+N22).$$

Expression (1) will be the RIAA correction function, if t1=3180 microseconds, t2=75 microseconds, t=318 microseconds.

This means that $$N12/N26\sim11,8.\quad(2)$$

The sum S1+S2 can be expressed now as $$S1+S2=(N21/N1)(K1+K2),$$

where $$K1=1/(1+i*w*t1),\quad(3)$$

$$K2=(N22/N21)/(1+i*w*t2),\quad(4)$$

K1 stands for correction with the highest time constant (3180 microseconds) and K2 stands for correction with the smallest time constant (75 microseconds). Factor K2 has an additional small parameter (N22/N21)≈0.085. This means that at small frequencies K1 dominates over K2.

Figure 3:
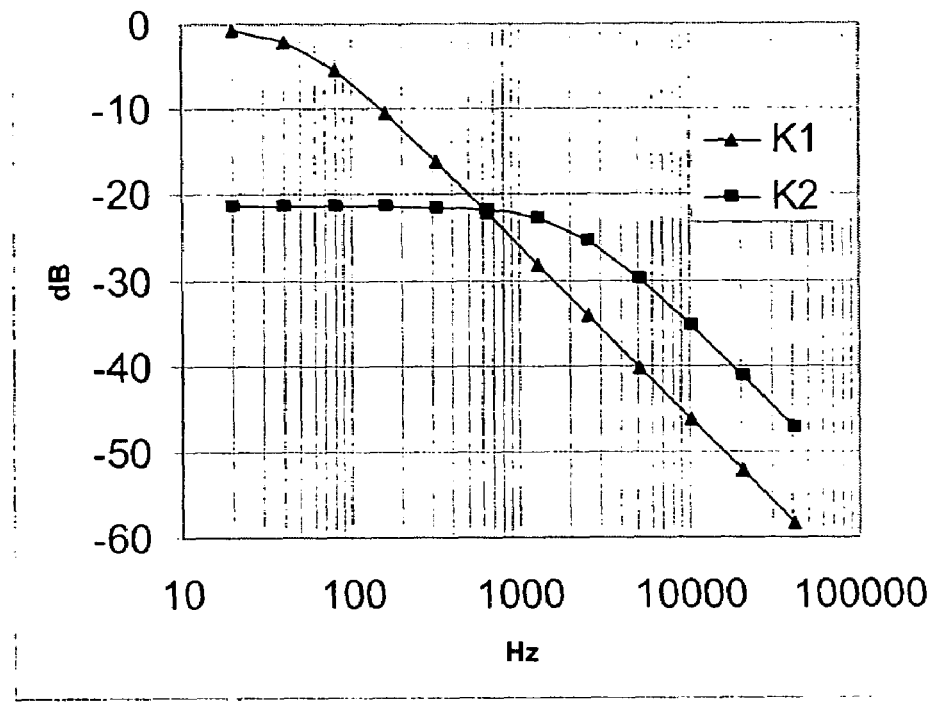
FIG. 3 shows the plots of two output signals K1 and K2 versus frequency according to an embodiment of the invention.

FIG. 3 shows plots of K1 and K2 versus frequency. The output of the signal is given by the sum of K1 and K2. As it follows from the plot, the role of K1 in the final sum is essential only at low and middle range of frequencies. At frequency of about 600 Hz K1≈K2. At frequencies higher than about 1 kHz the term K2 dominates. In particular, at frequencies higher than 2500 kHz K2 is greater by about 10 dB than K1.

Such analysis shows that the quality of components from which the circuit for K1 is made is important at low and middle frequencies, but at high frequencies they do not play the main role. In particular, it is possible for the sake of simplicity to make correction for K1 factor with the use of capacitors, and use qualitative inductive correction only for K2.

According to an embodiment of the invention a method of RIAA correction of audio frequency signal uses a transformer having a primary winding and two or more secondary windings, with two of the secondary windings playing essential role in RIAA-correction. According to this embodiment, the frequency correction of the signal coming from one of the secondary windings is carried out on a resistance and capacitance circuit (RC-type of correction), while frequency correction of the signal coming from another of the secondary windings is carried out with the use of an inductance and resistance circuit (RL type of correction).

Figure 4:
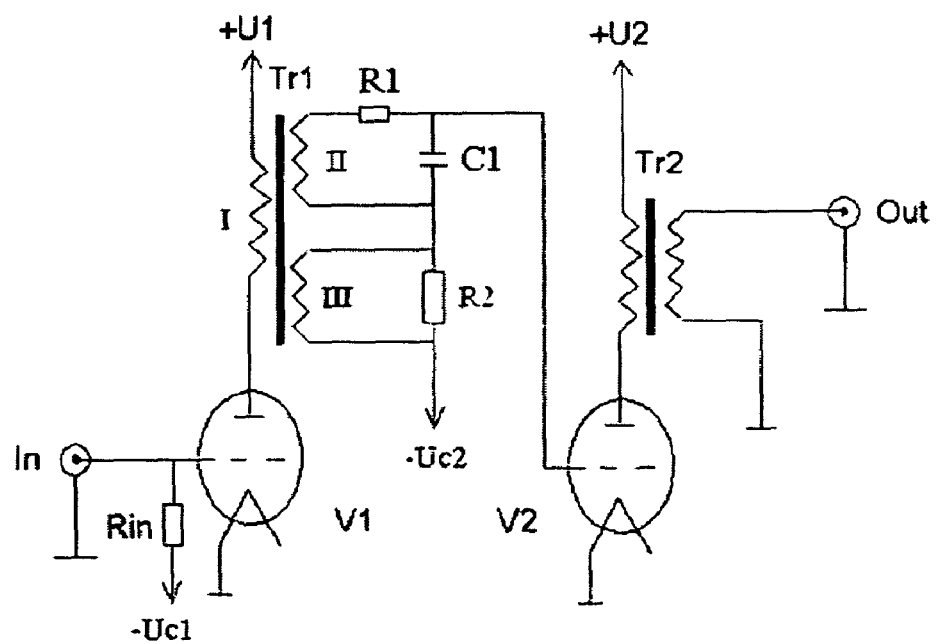
FIG. 4 shows a possible device according to an embodiment of the invention.

FIG. 4 shows a possible device for use with this embodiment of the invention. The device shown in FIG. 4 includes first and second amplifying triodes V1 and V2, first and second transformers Tr1 and Tr2, an input resistor Rin, and constant voltage supplies U1, U2, Uc1, Uc2.

An input signal In is applied to a grid of the first triode V1. The input resistor Rin is connected between the grid of the first triode V1 and constant voltage supply Uc1. An anode of the first triode V1 is connected to one end of the primary winding I of the first transformer Tr1. A second end of the primary winding I is connected to the constant voltage supply U1.

The correction according to the RIAA standard is carried out on the first transformer Tr1 and a first resistor R1, capacitor C1, and a second resistor R2. A grid of the second triode V2 is electrically connected to a point between the capacitor C1 and the first resistor R1. An anode of the second triode V2 is electrically connected to one end of a primary winding of the second transformer Tr2. A second end of the primary of Tr2 is connected to constant voltage supply U2. An output signal Out is produced at one end of a secondary winding of the second transformer Tr2.

The first transformer Tr1 has a primary winding I and first and second secondary windings II, III. The first secondary winding II and a circuit containing the capacitor C1 and the first resistor R1 is used for correction for the highest correction time constant 3180 microseconds. This correction is capacitor-based. The winding II doesn't have leakage inductance (i.e., $L1\approx0$), as is common for audio transformers.

The second secondary winding III and a circuit containing the second resistor R2 is used for the correction for the smallest correction time constant 75 microseconds. This correction is inductive and is based on a leakage inductance L2 of the transformer winding III.

For the given circuit the signal transmission function from the primary to the input of the second stage, neglecting the active resistances of the windings and losses in the core, may be given as:

$$S1+S2=(N21/N1)(X1+X2),$$

where $$X1=(1/i*w*C1)/(R1+(1/i*w*C1))=1/(1+i*w*z1),$$
$$z1=C1*R1,$$

and $$X2=(N22/N21)*R2/(R2+i*w*L2)=(N22/N21)/(1+i*w*t2).$$

These expressions will be same as (1)-(3) above if $z1=3180$ microseconds, $t2=75$ microseconds, $N22/N21\approx0.085$. For example, this holds for $C1=30$ nano-Farads, $R1=106$ kilo-ohms.

Such correction, as it was shown, will be subjective to comparison with pure inductive correction only up to the frequencies of about 1 KHz, and will be almost "inductive" at higher frequencies.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. In the claims that follow, the indefinite article "A", or "An" refers to a quantity of one or more of the item following the article, except where expressly stated otherwise. The appended claims are not to be interpreted as including means-plus-function or step-plus-function limitations, unless such a limitation is explicitly recited in a given claim using the phrase "means for" or "step for."

What is claimed is:

1. A method of RIAA correction of audio frequency signals, comprising using in a RIAA-correcting pre-amplifier a first transformer having a primary winding and two or more secondary windings, with two of the secondary windings playing an essential role in RIAA-correction, a first triode having an anode that is electrically connected to the primary winding of the first transformer, a second triode having a grid, a second transformer having a primary winding connected to an anode of the second triode and a secondary winding for providing an output, wherein frequency correction of a signal coming from a first secondary winding of the first transformer is carried out on a resistance and capacitance circuit (RC-type of correction) while frequency correction of a signal coming from a second secondary winding of the of the first transformer is carried out with the use of an inductance and resistance circuit (RL type of correction) wherein the resistance and capacitance circuit includes a resistor and capacitor, wherein the resistance and inductance circuit includes a resistor and inductance, wherein the resistance and capacitance circuit is coupled to the resistance and inductance circuit, and wherein the grid of the second triode is electrically connected either to the resistance and capacitance circuit or resistance and inductance circuit, wherein a leakage inductance of the first secondary winding is sufficiently small that a correction time constant z1 for the first secondary winding is approximately equal to a product of a resistance of the resistor and a capacitance of the capacitor.

2. The method of claim 1 wherein the resistance and capacitance circuit is characterized by a time constant of about 3180 microseconds.

3. The method of claim 2 wherein the inductance and resistance circuit is characterized by a time constant of about 75 microseconds.

4. A circuit for RIAA correction of audio frequency signals, comprising:
   a first transformer having a primary winding, a first secondary winding and a second secondary winding having a leakage inductance L2;
   a resistance and capacitance circuit including a first resistor having a resistance R1 and a capacitor having a capacitance C1 electrically connected to the first secondary winding; and
   a second resistor electrically connected in to the second secondary winding, the second resistor having a resistance R2,
   a first triode having an anode that is electrically connected to the primary winding of the first transformer
   a second triode having a grid that is electrically connected to the resistance and capacitance circuit; and
   a second transformer having a primary winding connected to an anode of the second triode and a secondary winding for providing an output
   wherein a leakage inductance of the first secondary winding is sufficiently small that a correction time constant z1 for the first secondary winding is approximately equal to a product of R1 and C1,
   wherein a correction time constant t2 for the second secondary winding is given by a ratio L2/R2.

5. The circuit of claim 4 wherein z1 is 3180 microseconds.

6. The circuit of claim 4 wherein t2 is 75 microseconds.

* * * * *